United States Patent
Shim et al.

(10) Patent No.: US 10,964,511 B2
(45) Date of Patent: Mar. 30, 2021

(54) SEMICONDUCTOR MANUFACTURING DEVICE AND METHOD OF OPERATING THE SAME

(71) Applicant: SAMSUNG ELECTRONICS CO., LTD., Suwon-si (KR)

(72) Inventors: Seung Bo Shim, Seoul (KR); Myung Sun Choi, Hwaseong-si (KR); Nam Jun Kang, Bucheon-si (KR); Doug Yong Sung, Seoul (KR); Sang Min Jeong, Seoul (KR); Peter Byung H Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 13 days.

(21) Appl. No.: 15/864,529

(22) Filed: Jan. 8, 2018

(65) Prior Publication Data

US 2019/0006150 A1    Jan. 3, 2019

(30) Foreign Application Priority Data

Jun. 30, 2017 (KR) ................. 10-2017-0083576

(51) Int. Cl.
| | | |
|---|---|---|
| *H01L 21/00* | (2006.01) | |
| *C23C 16/00* | (2006.01) | |
| *H01J 37/32* | (2006.01) | |
| *H01L 21/3065* | (2006.01) | |
| *H01L 21/67* | (2006.01) | |

(52) U.S. Cl.
CPC .. *H01J 37/32183* (2013.01); *H01L 21/30655* (2013.01); *H01L 21/67069* (2013.01); *H01J 2237/334* (2013.01)

(58) Field of Classification Search
CPC ................. H01J 37/32156; H01J 37/32155
See application file for complete search history.

(56) References Cited

U.S. PATENT DOCUMENTS

| | | |
|---|---|---|
| 6,916,746 B1 | 7/2005 | Hudson et al. |
| 7,683,289 B2 | 3/2010 | Dhindsa et al. |
| 8,440,473 B2 | 5/2013 | Xu et al. |
| 8,962,488 B2 * | 2/2015 | Liao .............. H01J 37/32082 156/345.48 |
| 9,030,101 B2 | 5/2015 | Valcore, Jr. et al. |
| 9,114,666 B2 | 8/2015 | Valcore, Jr. et al. |
| 9,269,587 B2 | 2/2016 | Shimizu et al. |

(Continued)

*Primary Examiner* — Sylvia MacArthur
*Assistant Examiner* — Michelle Crowell
(74) *Attorney, Agent, or Firm* — Lee IP Law, PC

(57) ABSTRACT

A semiconductor manufacturing device includes a plasma chamber, a source power supply, and first and second bias power supplies. The source power supply applies a first source voltage to the plasma chamber at a first time and a second source voltage to the plasma chamber at a second time. The first bias power supply applies a first turn-on voltage to the plasma chamber at the first time and a first turn-off voltage to the plasma chamber at the second time. The second bias power supply applies a second turn-off voltage to the plasma chamber at the first time and a second turn-on voltage to the plasma chamber at the second time. The plasma chamber forms plasmas of different conditions from a gas mixture in the plasma chamber based on the source, turn-on, and turn-off voltages.

19 Claims, 14 Drawing Sheets

(56) References Cited

U.S. PATENT DOCUMENTS

| | | | |
|---|---|---|---|
| 2008/0119049 A1* | 5/2008 | Sung | H01J 37/32091 438/689 |
| 2010/0248489 A1* | 9/2010 | Koguchi | H01J 37/32091 438/714 |
| 2012/0214313 A1* | 8/2012 | Ooya | H01J 37/02 438/712 |
| 2013/0049592 A1 | 2/2013 | Yeom et al. | |
| 2013/0126475 A1* | 5/2013 | Dhindsa | H01J 37/32091 216/61 |
| 2013/0168354 A1* | 7/2013 | Kanarik | H01J 37/32082 216/68 |
| 2013/0196511 A1* | 8/2013 | Nishimura | B82Y 40/00 438/712 |
| 2013/0213934 A1* | 8/2013 | Valcore, Jr. | B44C 1/22 216/67 |
| 2013/0260567 A1* | 10/2013 | Marakhtanov | H01J 37/32165 438/710 |
| 2014/0009073 A1* | 1/2014 | Valcore, Jr. | H01J 37/32183 315/183 |
| 2014/0345802 A1* | 11/2014 | Umehara | H05H 1/46 156/345.28 |
| 2016/0064193 A1* | 3/2016 | Kim | H01J 37/32174 118/723 R |
| 2016/0079037 A1* | 3/2016 | Hirano | H01J 37/32146 156/345.28 |
| 2016/0126069 A1* | 5/2016 | Kwon | H05B 31/26 315/111.21 |
| 2017/0229312 A1* | 8/2017 | Park | H01J 37/32082 |
| 2018/0053661 A1* | 2/2018 | Park | H01J 37/321 |
| 2018/0366335 A1* | 12/2018 | Tanaka | H01L 21/3065 |

\* cited by examiner

SEMICONDUCTOR MANUFACTURING DEVICE AND METHOD OF OPERATING THE SAME

CROSS-REFERENCE TO RELATED APPLICATION

Korean Patent Application No. 10-2017-0083576, filed on Jun. 30, 2017, and entitled, "Semiconductor Manufacturing Device and Method of Operating the Same," is incorporated by reference herein in its entirety.

BACKGROUND

1. Field

One or more embodiments herein relate to a semiconductor manufacturing device and a method for operating a semiconductor device.

2. Description of the Related Art

A variety of processes are used to manufacture semiconductor devices. Some processes (e.g., deposition, etching, etc.) accelerate a desired chemical reaction using plasma. For example, dry-etching processes may use plasma to etch semiconductor layers to form patterns of different widths. During these and other processes, an aspect ratio dependence etch (ARDE) phenomenon (e.g., varying of etch depth according to pattern width) may occur.

SUMMARY

In accordance with one or more embodiments, a semiconductor manufacturing device includes a plasma chamber to receive a gas mixture containing a first gas and a second gas different from each other; a source power supply to apply a source voltage of a first level to the plasma chamber at a first time and a source voltage of a second level different from the first level to the plasma chamber at a second time; a first bias power supply to apply a first turn-on voltage to the plasma chamber at the first time and a first turn-off voltage to the plasma chamber at the second time; and a second bias power supply to apply a second turn-off voltage to the plasma chamber at the first time and a second turn-on voltage to the plasma chamber at the second time, wherein the plasma chamber is to form plasma of a first condition from the gas mixture based on the source voltage of the first level and the first turn-on voltage at the first time and is to form plasma of a second condition, which is different from the first condition, from the gas mixture based on the source voltage of the second level and the second turn-on voltage at the second time.

In accordance with one or more other embodiments, a semiconductor manufacturing device includes a plasma chamber to receive a gas mixture containing a first gas and a second gas different from each other; a source power supply to apply a source voltage of a first level to the plasma chamber at a first time and a source voltage of a second level different from the first level to the plasma chamber at a second time; a first bias power supply to apply a first turn-on voltage to the plasma chamber at the first time and a first turn-off voltage to the plasma chamber at the second time; a second bias power supply to apply a second turn-off voltage to the plasma chamber at the first time and a second turn-on voltage to the plasma chamber at the second time; a first matching circuit connected between the source power supply and the plasma chamber; a second matching circuit connected between the first bias power supply and the plasma chamber; a third matching circuit connected between the second bias power supply and the plasma chamber; and a controller to control impedance matching between the first through third matching circuits and the plasma chamber, wherein the controller is to control impedance matching by controlling capacitances of the first matching circuit and the second matching circuit at the first time and is to control impedance matching by controlling an RF frequency of the source power supply and an RF frequency of the second bias power supply at the second time.

In accordance with one or more other embodiments, a method of operating a semiconductor manufacturing device includes providing a gas mixture containing a first gas and a second gas to a plasma chamber; forming plasma of a first condition from the gas mixture by applying a source voltage of a first level and a first turn-on voltage to the plasma chamber at a first time; and forming plasma of a second condition from the gas mixture by applying a source voltage of a second level and a second turn-on voltage to the plasma chamber at a second time, wherein the first condition is different from the second condition.

In accordance with one or more other embodiments, a non-transitory computer-readable medium stores code for operating a processor, the code including first code to apply a first source voltage to a plasma chamber at a first time; second code to apply a second source voltage to the plasma chamber at a second time; third code to apply a first turn-on voltage to the plasma chamber at the first time and a first turn-off voltage to the plasma chamber at the second time; and fourth code to apply a second turn-off voltage to the plasma chamber at the first time and a second turn-on voltage to the plasma chamber at the second time, wherein the plasma chamber includes a gas mixture and wherein plasma of a first condition is to be generated in the plasma chamber at the first time and plasma of a second condition is to be generated in the plasma chamber at the second time.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
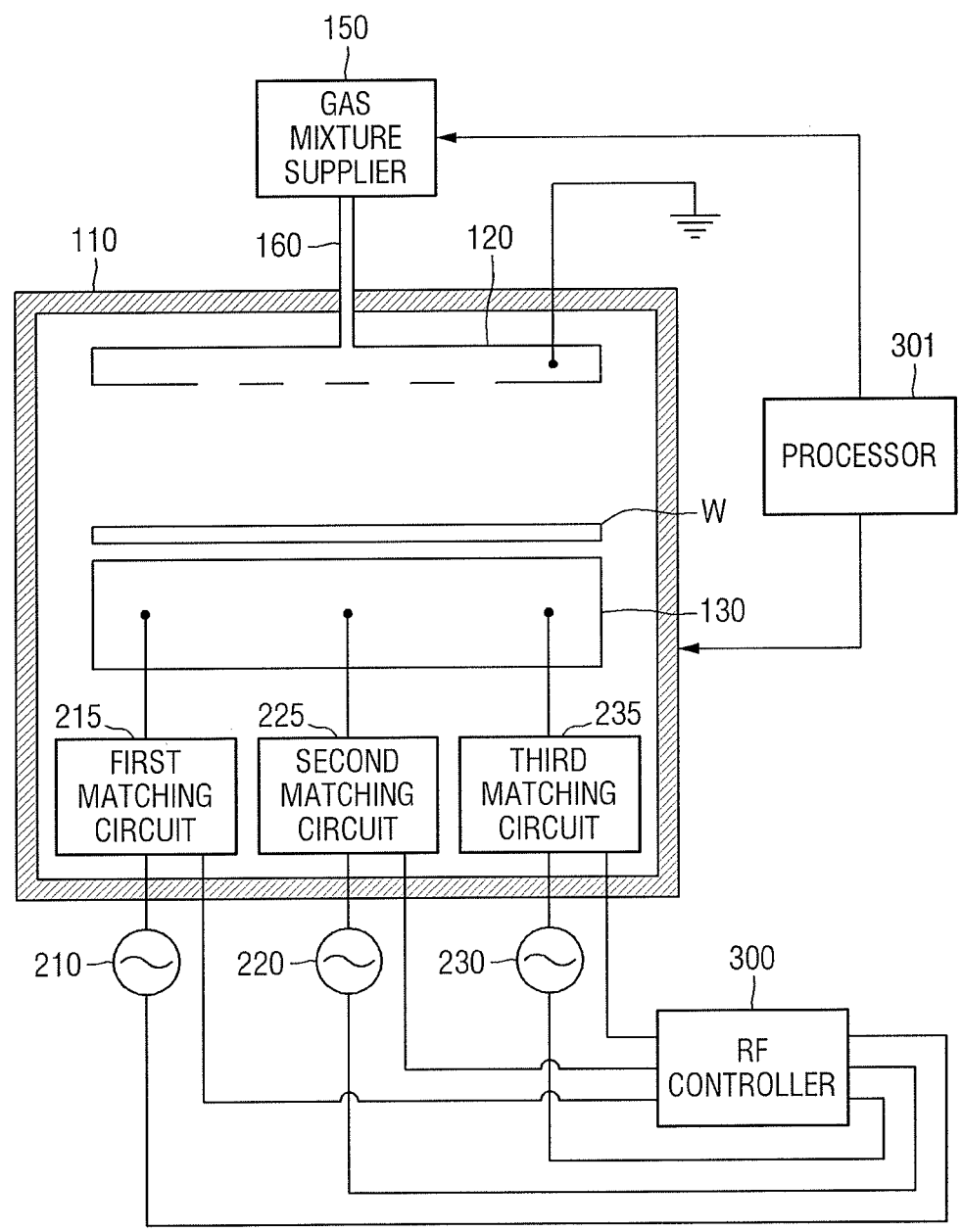
FIG. 1 illustrates an embodiment of a semiconductor manufacturing device.

FIG. 1 illustrates an embodiment of a semiconductor manufacturing device which includes a plasma chamber 110, an upper electrode 120, a lower electrode 130, a gas mixture supplier 150, a gas mixture supply pipe 160, a source power supply 210, a first matching circuit 215, a first bias power supply 220, a second matching circuit 225, a second bias power supply 230, a third matching circuit 235, and a radio frequency (RF) controller 300.

The plasma chamber 110 may receive a gas mixture from the gas mixture supplier 150 and form plasma from the gas mixture. The plasma chamber 110 may perform a plasma treatment process on a wafer W using the formed plasma. In some embodiments, the plasma chamber 110 may perform a deposition process, an etching process, and the like on the wafer W. In some embodiments, the plasma chamber 110 may operate in a capacitively coupled plasma (CCP) manner. Therefore, ions or electrons may move up or down in the plasma chamber 110.

The upper electrode 120 may be within the plasma chamber 110 and above the wafer W and the lower electrode 130 supporting the wafer W. In some embodiments, the upper electrode 120 may be a shower head that supplies a gas mixture to the plasma chamber 110. A gas mixture from the gas mixture supplier 150 is supplied to the upper electrode 120 through the gas mixture supply pipe 160. The upper electrode 120 may discharge the gas mixture through a plurality of openings formed in its surface. In some embodiments, the upper electrode 120 may be connected to a ground terminal. A separate power supply may be connected to the upper electrode 120.

The lower electrode 130 may be within the plasma chamber 110 and under the wafer W to support the wafer W. The lower electrode 130 may include an electrostatic chuck that is in contact with the wafer W. The lower electrode 130 may be electrically connected to the source power supply 210 and the first matching circuit 215. The lower electrode 130 may receive a source voltage from the source power supply 210. The lower electrode 120 may receive RF power in the form of a pulse from the source power supply 210.

The lower electrode 130 may be electrically connected to the first bias power supply 220 and the second matching circuit 225. The lower electrode 130 may receive a first turn-on voltage and a first turn-off voltage from the first bias power supply 220. The lower electrode 130 may be electrically connected to the second bias power supply 230 and the third matching circuit 235. The lower electrode 130 may receive a second turn-on voltage and a second turn-off voltage from the second bias power supply 230.

In FIG. 1, the source power supply 210, the first bias power supply 220, and the second bias power supply 230 are connected to the lower electrode 130. In one embodiment, the source power supply 210 may be connected to the upper electrode 120, and the first bias power supply 220 and the second bias power supply 230 may be connected to the lower electrode 130. Further, in some embodiments, the source power supply 210, the first bias power supply 220, and the second bias power supply 230 may all be connected to the upper electrode 120.

In operation, in accordance with one or more embodiments, the upper electrode 120 and the lower electrode 130 may be electrically connected to each other. For example, an electric circuit may be formed between the upper and lower electrodes 120 and 130 and a gas mixture supplied to the plasma chamber 110. The upper electrode 120 and the lower electrode 130 may be capacitively coupled to the gas mixture supplied to the plasma chamber 110.

The lower electrode 130 may supply power to the formed electric circuit and form plasma from the gas mixture supplied to the plasma chamber 110 in order to treat the wafer W with the plasma. When power is supplied to the lower electrode 130 and a gas mixture is supplied into the plasma chamber 110 to form plasma, a capacitive path may be formed between the upper electrode 120 and the lower electrode 130.

In order to form plasma with a predetermined (e.g., maximum) power in the plasma formation process of the semiconductor manufacturing device, reflected power of the electric circuit formed by the upper electrode 120 and the lower electrode 130 may be reduced or minimized. For example, as the reflected power generated from the electric circuit formed by the upper electrode 120 and the lower electrode 130 increases, the total power for forming plasma decreases. The reflected power may be reduced or minimized by matching the impedance of the electric circuit formed by the upper electrode 120 and the lower electrode 130 to the impedances of the source power supply 210, the first bias power supply 220, and the second bias power supply 230.

Examples for matching the impedance of the electric circuit formed by the upper electrode 120 and the lower electrode 130 to the impedances of the source power supply 210, the first bias power supply 220, and the second bias power supply 230 are discussed below.

The gas mixture supplier 150 may supply a gas mixture to the plasma chamber 110 through the gas mixture supply pipe 160. In some embodiments, the gas mixture that the gas mixture supplier 150 supplies to the plasma chamber 110 may be a mixture of two or more gases, for example, a mixture of fluorocarbon ($C_xF_y$) and oxygen ($O_2$) gases.

In FIG. 1, one gas mixture supplier 150 is connected to the plasma chamber 110 by the gas mixture supply pipe 160. In one embodiment, two or more gas mixture suppliers 150 may be connected to the plasma chamber 110 by supply pipes. When two or more gas mixture suppliers 150 are connected to the plasma chamber 110, different gases supplied from the two or more gas mixture suppliers 150 may be mixed within the plasma chamber 110.

The source power supply 210 may be connected to the lower electrode 130 and may be electrically connected to the lower electrode 130 by the first matching circuit 215. The source power supply 210 may be connected to the RF controller 300 and controlled by an instruction from the RF controller 300. For example, the RF controller 300 may control the RF frequency of the source voltage applied from the source power supply 210. In some embodiments, the source power supply 210 may include a voltage source which generates a voltage in the form of a predetermined (e.g., sine) wave and a rectifier circuit which generates a voltage in the form of a pulse by filtering the voltage generated by the voltage source.

The first matching circuit 215 may be connected between the lower electrode 130 and the source power supply 210. The first matching circuit 215 may be controlled by the RF controller 300 to match the impedance of the electric circuit formed by the upper electrode 120 and the lower electrode 130 to the impedance of the source power supply 210.

Figure 2A:
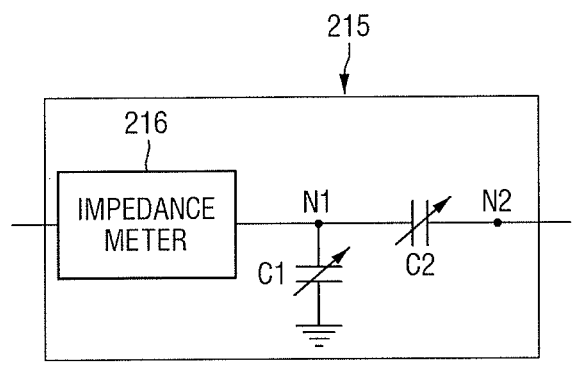
FIGS. 2(a)-2(c) illustrate embodiments of matching circuits.
Figure 2B:
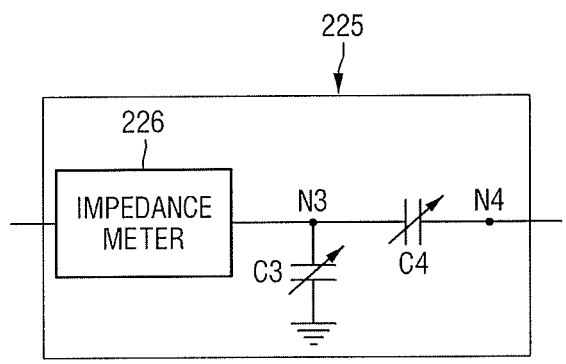
Figure 2C:
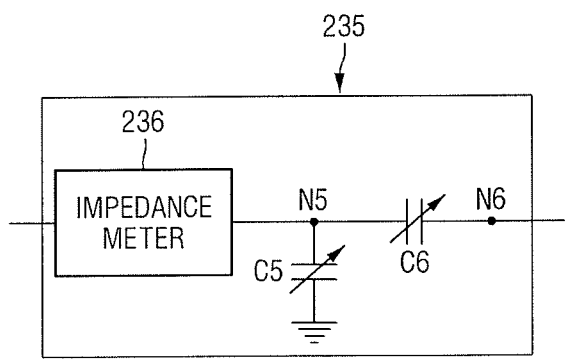

FIGS. 2(a)-(c) illustrate embodiments of the first, second and third matching circuits 215, 225, and 235 illustrated in FIG. 1.

Referring to FIG. 2(a), the first matching circuit 215 may include a first impedance meter 216, a first variable capacitor C1, and a second variable capacitor C2. The first matching circuit 215 may have a first end electrically connected to the lower electrode 130 and a second end electrically connected to the source power supply 210. For example, a second node N2 of the first matching circuit 215 may be connected to the source power supply 210, and the first impedance meter 216 may be connected to the upper electrode 120. In one embodiment, the second node N2 may be connected to the upper electrode 120, and the first impedance meter 216 can be connected to the source power supply 210.

The first variable capacitor C1 may be connected in parallel to the first node N1. The capacitance of the first variable capacitor C1 may be changed by an instruction from the RF controller 300, which controls the first matching circuit 215. The first variable capacitor C1 may include, for example, a vacuum variable capacitor (VVC). The first variable capacitor C1 may receive a control signal from the RF controller 300 and mechanically adjust a gap between two electrodes therein to change its capacitance.

The second variable capacitor C2 may be connected in series between the first node N1 and the second node N2. Like the first variable capacitor C1, the second variable capacitor C2 may include a VVC. The second variable capacitor C2 may be controlled by the RF controller 300 to change its capacitance.

The first impedance meter 216 may be connected to the first node N1. The first impedance meter 216 may measure the impedance of the plasma chamber 110 and provide a measured value to the RF controller 300. In some embodiments, the first impedance meter 216 may measure the reflected power when the source voltage is applied to the plasma chamber 110 and provide the measurement result to the RF controller 300.

The way in which the first impedance meter 216, the first variable capacitor C1, and the second variable capacitor C2 are connected in FIG. 2A is merely an example. These circuit elements may be electrically connected to each other in different ways in other embodiments. In one embodiment, capacitors, inductance elements, and/or other circuit devices may also be connected to the first node N1 and the second node N2 to configure the first matching circuit 215 as a T-type network or a π-type network. The inductance elements may have varying inductances under the control of the RF controller 300.

The first bias power supply 220 may be connected to the lower electrode 130 and may be electrically connected to the lower electrode 130 by the second matching circuit 225. The first bias power supply 220 may be connected to the RF controller 300 and controlled by an instruction from the RF controller 300. For example, the RF controller 300 may control the RF frequency of a first bias voltage applied from the first bias power supply 220, the magnitude of the first turn-on voltage or the first turn-off voltage of the first bias voltage, and/or the duty cycle of the first bias voltage.

The second matching circuit 225 may be connected between the lower electrode 130 and the first bias power supply 220. The second matching circuit 225 may be controlled by the RF controller 300 to match the impedance of the electric circuit formed by the upper electrode 120 and the lower electrode 130 to the impedance of the first bias power supply 220.

The second bias power supply 230 may be connected to the lower electrode 130 and may be electrically connected to the lower electrode 130 by the third matching circuit 235. The second bias power supply 230 may be connected to the RF controller 300. The RF controller 300 may control the RF frequency of a second bias voltage applied from the second bias power supply 230.

Examples of the second matching circuit 225 and the third matching circuit 235 are illustrated in FIGS. 2(b) and 2(c), respectively.

Referring to FIGS. 2(b) and 2(c), the second matching circuit 225 and the third matching circuit 235 may have a structure similar to the first matching circuit 215. For example, the second matching circuit 225 may include a third variable capacitor C3 and a fourth variable capacitor C4 connected to a third node N3, and may also include a second impedance meter 226. The third matching circuit 235 may include a fifth variable capacitor C5 and a sixth variable capacitor C6 connected to a fifth node N5, and may also include a third impedance meter 236.

The second matching circuit 225 and the third matching circuit 235 may operate in a manner similar to the first matching circuit 215. For example, the second matching circuit 225 may change the capacitances of the third variable capacitor C3 and the fourth variable capacitor C4 based on an instruction from the RF controller 300 and may match the impedance of the electric circuit formed by the upper electrode 120 and the lower electrode 130 to the impedance of the first bias power supply 220.

In addition, the third matching circuit 235 may change the capacitances of the fifth variable capacitor C5 and the sixth variable capacitor C6 based on an instruction from the RF controller 300 and may match the impedance of the electric circuit formed by the upper electrode 120 and the lower electrode 130 to the impedance of the second bias power supply 230.

In accordance with at least one embodiment, the term "impedance matching" may denote matching the impedance of a power supply and the impedance of a load. To reduce or minimize the reflected power of the electric circuit formed by the upper electrode 120 and the lower electrode 130 in the plasma chamber 110, the complex impedance of the power supply may be equal to the complex impedance of the load. The complex impedance of the power supply may be, for example, 50 ohms (Ω). Therefore, each of the first, second and third matching circuits 215, 225 and 235 may adjust the values of its variable capacitances, so that the impedance of the electric circuit formed by the upper electrode 120 and the lower electrode 130 and the impedance of the matching circuit become, for example, 50Ω.

As in the first matching circuit 215, the way in which the second and third impedance meters 226 and 236 and the third through sixth variable capacitors C3 through C6 are connected in FIGS. 2B and 2C is merely an example. These circuit elements may be electrically connected to each other in different ways in other embodiments. In some embodiments, capacitors, inductance elements, and/or other circuit devices may also be connected to the third through sixth nodes N3 through N6 to configure the second matching circuit 225 or the third matching circuit 235 as a T-type network or a π-type network.

The RF controller 300 may be connected to the source power supply 210, the first bias power supply 220, and the second bias power supply 230. The RF controller 300 may control the RF frequencies of voltages applied by the source power supply 210, the first bias power supply 220, and the second bias power supply 230.

Figure 3A:
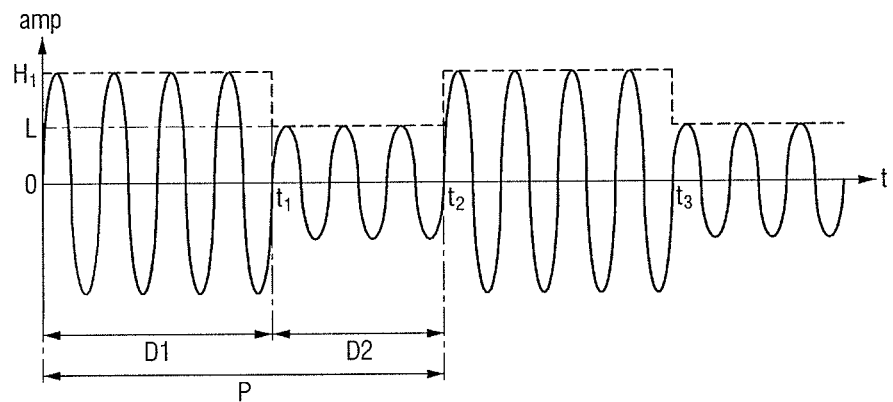
FIGS. 3(a)-3(c) illustrates examples of timing diagrams for operating the semiconductor manufacturing device.
Figure 3B:
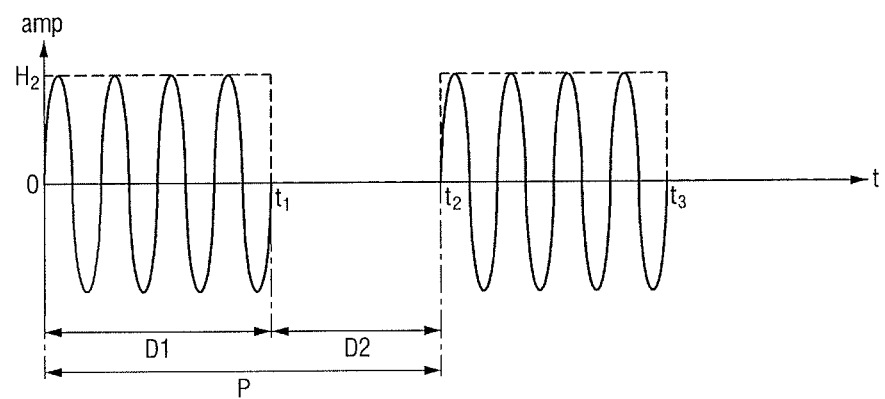

FIGS. 3(a)-3(b) illustrate examples of timing diagrams for operating the source power supply 210, the first bias power supply 220, and the second bias power supply 230 of FIG. 1.

Referring to FIG. 3(a), a power supply voltage applied by the source power supply 210 may be a voltage in the form of a pulse having a certain period P. The source power supply 210 may apply a source voltage having a first level $H_1$ in a first duty cycle D1 and apply a source voltage having a second level L in a second duty cycle D2. For example, the source power supply 210 may apply the source voltage having the first level $H_1$ at a first time (e.g., origin) and apply the source voltage having the second level L at a second time t1. The first level $H_1$ and the second level L may be different from each other. In one embodiment, voltage levels applied by the source power supply 210 in the first duty cycle D1 and the second duty cycle D2 may be equal to each other.

In some embodiments, the voltage source in the source power supply 210 may generate a source voltage having a frequency of about 100 to 200 MHz. However, since the source power supply 210 generates a source voltage in the form of a pulse as described above, the period P of the source voltage may be shorter than an oscillation period of a voltage generated by the voltage source in the source power supply 210. The period P may be, for example, about 1 ms. As will all of the values described herein, the period P may be different in other embodiments.

The first bias voltage applied by the first bias power supply 220 may also be a voltage in the form of a pulse having a certain period P. The first bias power supply 220 may apply a first turn-on voltage $V_{ON1}$ having a third level $H_2$ to the lower electrode 130 in the first duty cycle D1 and apply a first turn-off voltage $V_{OFF1}$ to the lower electrode 130 in the second duty cycle D2.

Referring to FIG. 3(a), the magnitude of the first turn-off voltage $V_{OFF1}$ is zero; but the magnitude of the first turn-off voltage $V_{OFF1}$ may be a non-zero value in another embodiment. The first bias power supply 220 may also apply the first turn-off voltage $V_{OFF1}$ of greater than zero to the lower electrode 130 without being completely turned off in the second duty cycle D2. In some embodiments, a voltage source in the first bias power supply 220 may generate a voltage having a frequency of about 2 to 100 MHz. However, as described above, the first bias power supply 220 may provide the lower electrode 130 with the first bias voltage in the form of a pulse having the period P.

The second bias voltage applied by the second bias power supply 230 may also be a voltage in the form of a pulse having a certain period P. The second bias power supply 230 may apply a second turn-off voltage $V_{OFF2}$ to the lower electrode 130 in the first duty cycle D1 and apply a second turn-on voltage $V_{ON2}$ having a fourth level $H_3$ to the lower electrode 130 in the second duty cycle D2. In some embodiments, a voltage source in the second bias power supply 230 may generate a voltage having a frequency of about 0 to 2 MHz. However, as described above, the second bias power supply 230 may provide the lower electrode 130 with the second bias voltage in the form of a pulse having the period P.

Figure 3C:
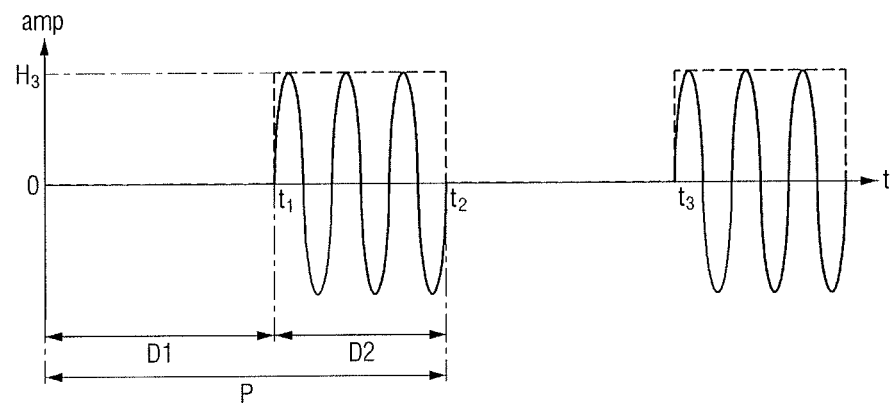

Referring to FIG. 3(c), the magnitude of the second turn-off voltage $V_{OFF2}$ is zero; but the magnitude of the second turn-off voltage $V_{OFF2}$ may be a non-zero value in another embodiment. The second bias power supply 230 may also apply the second turn-off voltage $V_{OFF2}$ of greater than zero to the lower electrode 130 without being completely turned off in the first duty cycle D1.

In summary, according to one or more embodiments, the semiconductor manufacturing device may apply the source voltage having the first level $H_1$ and the first turn-on voltage $V_{ON1}$ having the third level $H_2$ to the lower electrode 130 during the first duty cycle D1 from the first time (e.g., origin). Then, the semiconductor manufacturing device according to these or other embodiments may provide the source voltage having the second level L and the second turn-on voltage $V_{ON2}$ having the fourth level $H_3$ to the lower electrode 130 during the second duty cycle D2 from the second time t1.

Thereafter, the voltage application of the source power supply 210, the first bias power supply 220, and the second bias power supply 230 may be repeated at a third time t2 and a fourth time t3 in the same manner as before.

A gas mixture supplied to the plasma chamber 110 may be processed by voltages applied from the source power supply 210 and the first bias power supply 220 during the first duty cycle D1. The gas mixture may then be processed by voltages applied from the source power supply 210 and the second bias power supply 230 during the second duty cycle D2. The ratio of the two or more gases mixed in the mixed gas can be kept constant at the first duty cycle D1 and the second duty cycle D2. An example of plasma treatment in the first duty cycle D1 and the second duty cycle D2 will now be described with reference to FIGS. 4 through 6B.

Figure 4:
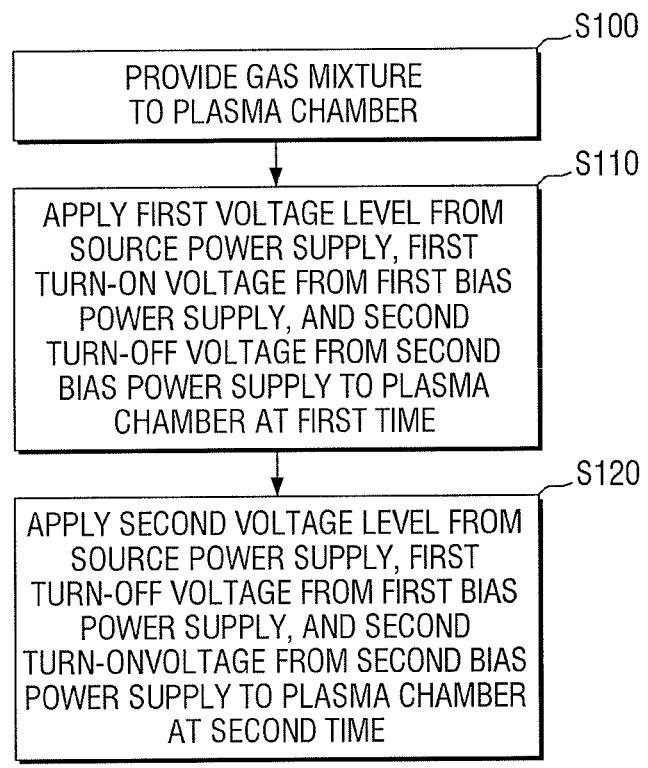
FIG. 4 illustrates an embodiment of a method for operating a semiconductor manufacturing device.
Figure 5A:
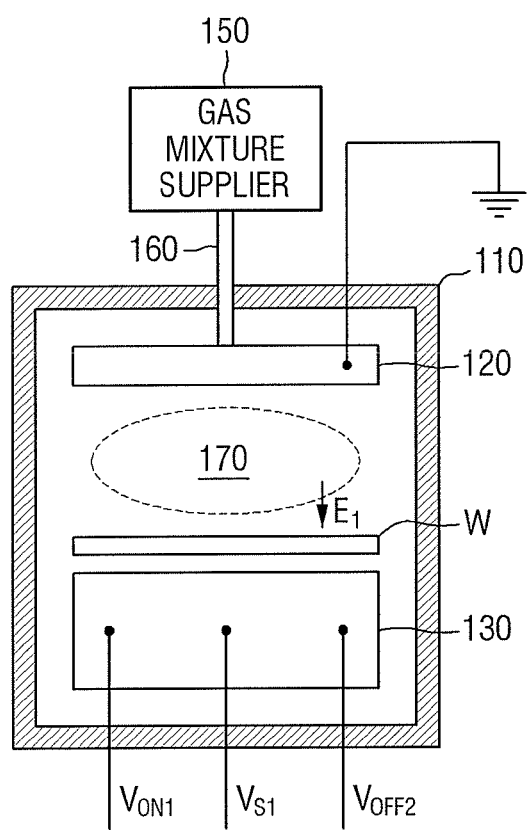
FIGS. 5A and 5B illustrate embodiments for operating the semiconductor manufacturing device.

FIG. 4 illustrates an embodiment of a method for operating a semiconductor manufacturing device. Referring to FIGS. 4 and 5A, a gas mixture is first provided to a plasma chamber 110 (operation S100). The gas mixture may be a mixture of two or more gases and may include, but is not limited to, fluorocarbon ($C_xF_y$) and oxygen ($O_2$) gases.

Then, at a first time, a source voltage $V_{S1}$ of a first level from a source power supply 210, a first bias voltage of a first turn-on voltage $V_{ON1}$ from a first bias power supply 220, and a second bias voltage of a second turn-off voltage $V_{OFF2}$ from a second bias power supply 230 are applied to the plasma chamber 110 (operation S110). At the first time, the plasma chamber 110 may form plasma of a first condition from the gas mixture through the source power supply 210 and the first bias power supply 220.

The source power supply 210 may generate radicals from the gas mixture by applying the source voltage $V_{S1}$ of the first level. For example, as described above, the source power supply 210 may have an RF frequency of about 100 to 200 MHz, so that formed plasma may have high electron heating efficiency and low ion incident energy generation characteristics. Thus, the radicals generated using the source voltage $V_{S1}$ of the first level may generate a deposition reaction on a wafer due to low ion incident energy.

The first bias power supply 220 may accelerate ion particles within the plasma chamber 110 with a first energy E1 by applying the first bias voltage of the first turn-on voltage $V_{ON1}$. The ion particles accelerated with the first energy E1 may generate a sputtering reaction on the wafer. The ion particles accelerated by the first turn-on voltage $V_{ON1}$ may be accelerated with an energy of, e.g., 50 to 150 eV.

As described above, the first bias voltage and the source voltage are applied together to the plasma chamber 110 at the first time. Therefore, at the first time, a deposition reaction may be generated on the wafer based on the source voltage $V_{S1}$ of the first level. A sputtering reaction may be generated on the wafer based on the first bias voltage of the first turn-on voltage $V_{ON1}$. Thus, the rate of the deposition reaction on the wafer and the profile of a deposited passivation film may be controlled.

Figure 5B:
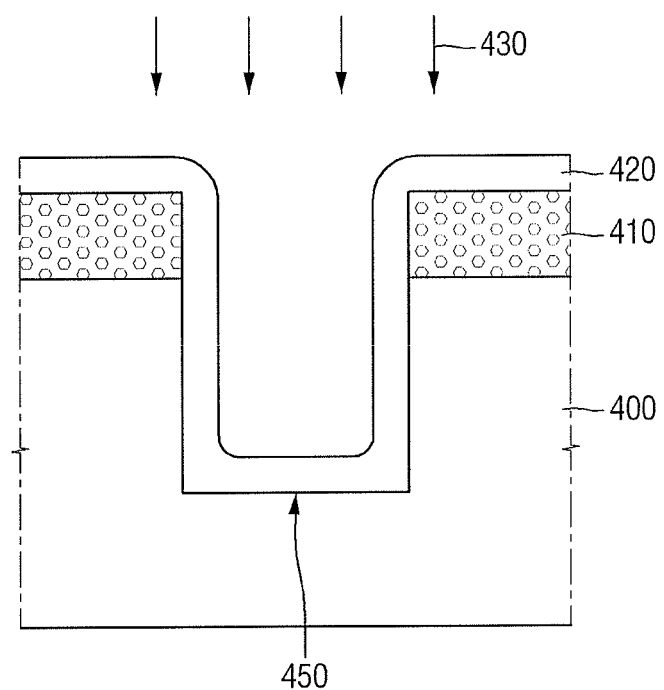

Referring to FIG. 5B, a passivation film 420 is deposited on a mask pattern 410 which is formed on a semiconductor layer 400 having a trench 450. Particles 430 accelerated by the first bias voltage may generate a deposition reaction and a sputtering reaction on the semiconductor layer 400 and form the conformal passivation film 420.

Figure 6A:
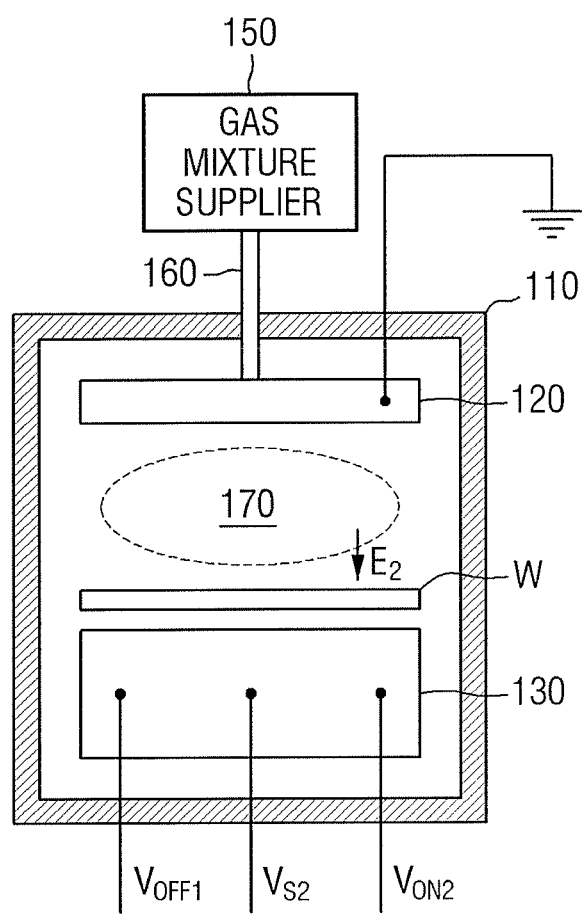
FIGS. 6A and 6B illustrate additional embodiments for operating the semiconductor manufacturing device.

Referring to FIGS. 4 and 6A, at a second time, a second level L from the source power supply 210, a first turn-off voltage $V_{OFF1}$ from the first bias power supply 220, and a second turn-on voltage $V_{ON2}$ from the second bias power supply 230 are applied to the plasma chamber 110 (operation S120). At the second time, the plasma chamber 110 may form plasma of a second condition from the gas mixture through the source power supply 210 and the second bias power supply 230. The second condition may be different from the first condition.

The source power supply 210 may generate radicals from the gas mixture by applying the source voltage $V_{S2}$ of the second voltage level. The radicals generated by the source voltage $V_{S2}$ of the second voltage level may also generate a deposition reaction on the wafer.

The second bias power supply 230 may accelerate the ion particles within the plasma chamber 110 with a second energy E2 by applying the second bias voltage of the second turn-on voltage $V_{ON2}$. In some embodiments, the second energy E2 may be greater than the first energy E1, e.g., the second energy E2 may be 500 to 1000 eV. The ion particles accelerated by the second energy E2 may generate an etching reaction on the wafer.

Figure 6B:
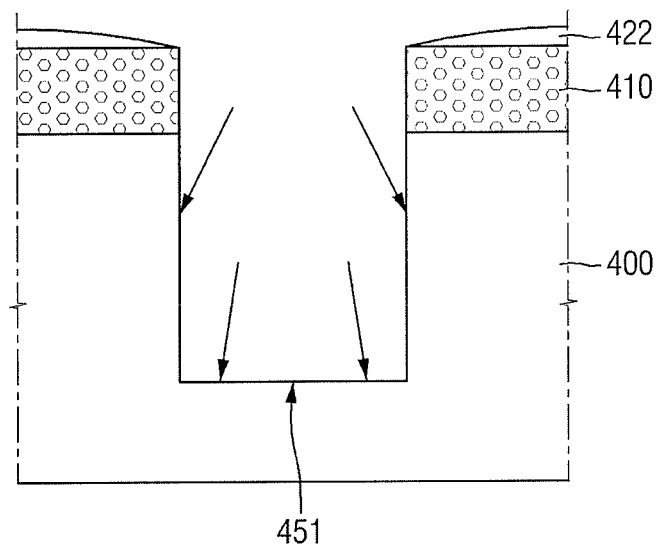

Referring to FIG. 6B, the semiconductor layer 400 and the passivation film 422 are etched together by ion particles 435 accelerated with the second energy E2. The etching process may result in the formation of a deeper trench 451.

In summary, in the semiconductor manufacturing device according to one or more embodiments, the source power supply 210 and the first bias power supply 220 apply voltages to the plasma chamber 110 at a first time to generate a deposition reaction of a passivation film on a wafer W. Then, at a second time, the source power supply 210 and the second bias power supply 230 apply voltages to the plasma chamber 110 to generate an etching reaction on the wafer W. Since deposition and etching of the passivation film are performed in a short cycle, the uniformity of pattern etching on the wafer W may be improved.

Figure 7:
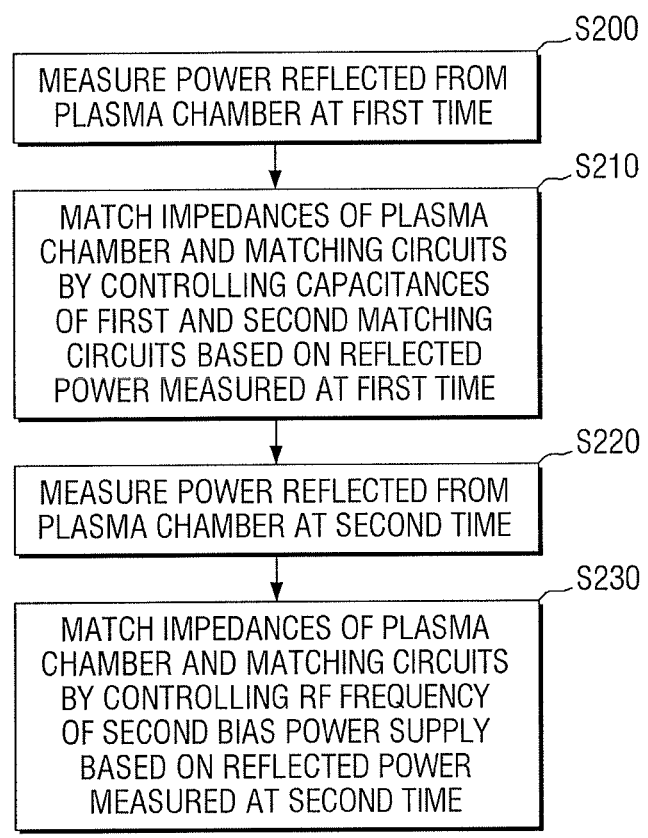
FIG. 7 illustrates an embodiment of an impedance matching operation.

FIG. 7 illustrates an embodiment of a method for impedance matching a semiconductor manufacturing device, which, for example, may corresponds to any of the semiconductor manufacturing devices described herein.

Referring to FIG. 7, power reflected from a plasma chamber 110 is measured at a first time (operation S200). As described above, the reflected power of the plasma chamber 110 is generated based on the difference between the internal impedances of a source power supply 210, a first bias power supply 220, and a second bias power supply 230 for applying voltages to a lower electrode 130 and the impedance of an electric circuit formed by an upper electrode 120 and the lower electrode 130. Each of first, second, and third meters 216, 226, and 236 in first, second and third matching circuits 215, 225, and 235 may measure the impedance in the plasma chamber 110 and the power reflected from the plasma chamber 110 at the first time. The reflected power or the impedance value measured at the first time may be provided to an RF controller 300.

Next, first through fourth variable capacitors C1 through C4 of the first matching circuit 215 and the second matching circuit 225 are controlled based on the reflected power measured at the first time, in order to match the impedances of the plasma chamber 110 and the first matching circuit 215 and to match the impedances of the plasma chamber 110 and the second matching circuit 225 (operation S210).

As described above, the first through fourth variable capacitors C1 through C4 in the first and second matching circuits 215 and 225 may be VVCs, for example. When the first through fourth variable capacitors C1 through C4 are VVCs, the RF controller 300 may change the capacitance of each of the first through fourth variable capacitors C1 through C4 by mechanically adjusting the gap between two electrodes in each of the first through fourth variable capacitors C1 through C4.

Next, power reflected from the plasma chamber 110 is measured at a second time (operation S220). Each of the first, second and third impedance meters 216, 226 and 236 in the first, second, and third matching circuits 215, 225, and 235 may measure the impedance in the plasma chamber 110 and the power reflected from the plasma chamber 110 at the second time. The reflected power or impedance value measured at the second time may be provided to the RF controller 300.

Next, RF frequencies of the source power supply 210 and the second bias power supply 230 are controlled based on the reflected power measured at the second time to match the impedances of the plasma chamber 110 and the first matching circuit 215 and match the impedances of the plasma chamber 110 and the third matching circuit 235 (operation S230).

When the RF frequency of a source voltage applied from the source power supply 210 and the RF frequency of a second bias voltage applied from the second bias power supply 230 are changed, the impedance value in the plasma chamber 110 may change accordingly. The first and third impedance meters 216 and 236 may measure the reflected power or the impedance value in the plasma chamber 110 and provide the measured reflected power or impedance value to the RF controller 300. Then, the RF controller 300 may change the RF frequency of the source voltage and the RF frequency of the second bias voltage based on the measured reflected power or impedance value in the plasma chamber 110.

In summary, according to one or more embodiments, the impedance matching method used by the semiconductor manufacturing device reduces reflected power by performing impedance matching through control of the capacitance of a variable capacitor in a matching circuit at a first time and performing impedance matching through control of the RF frequency of a voltage applied from a power supply at a second time.

When the variable capacitor in the matching circuit is a VVC that operates based on mechanical motion to adjust its capacitance as described above, it may be difficult to rapidly adjust the capacitance in each of the first and second duty cycles D1 and D2 which are 1 ms or less. Therefore, according to one or more embodiments, the semiconductor manufacturing device may alternately perform variable capacitance control and voltage RF frequency control at the first time and the second time. Therefore, even when a switch between the deposition of a passivation film and the etching of a semiconductor layer is fast, the reflected power may be reduced or minimized through impedance matching.

Figure 8:
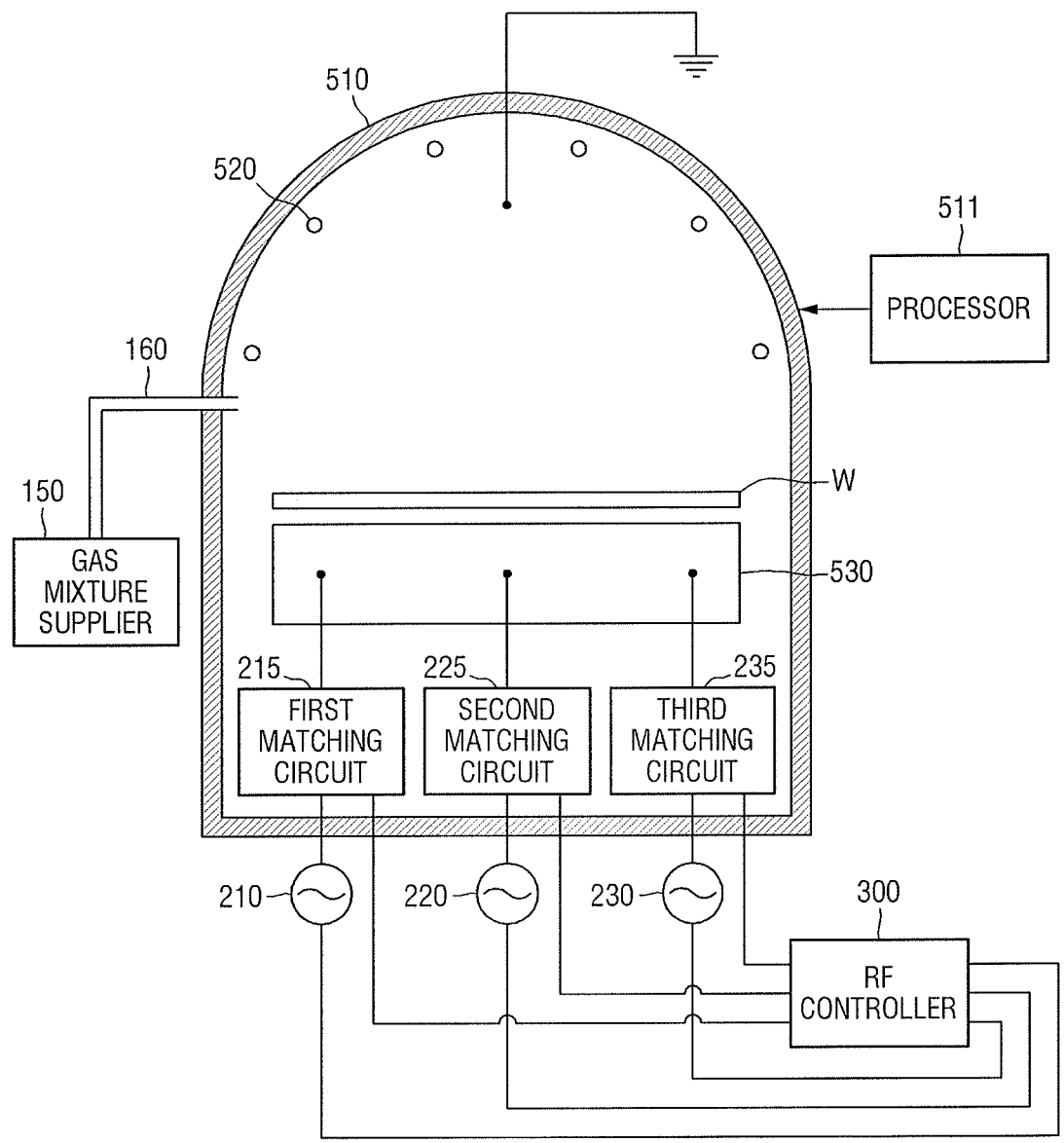
FIG. 8 illustrates another embodiment of a semiconductor manufacturing device.

FIG. 8 illustrates another embodiment of a semiconductor manufacturing device. Referring to FIG. 8, a plasma chamber 510 and an upper electrode 520 of the semiconductor manufacturing device may be configured in a different way from the plasma chamber 110 and the upper electrode 120 of one or more other embodiments. For example, the upper electrode 520 may be provided in the form of a coil wound around an upper part of the plasma chamber 510. The upper electrode 520 and the lower electrode 530 may be coupled inductively to form an electric circuit.

Figure 9:
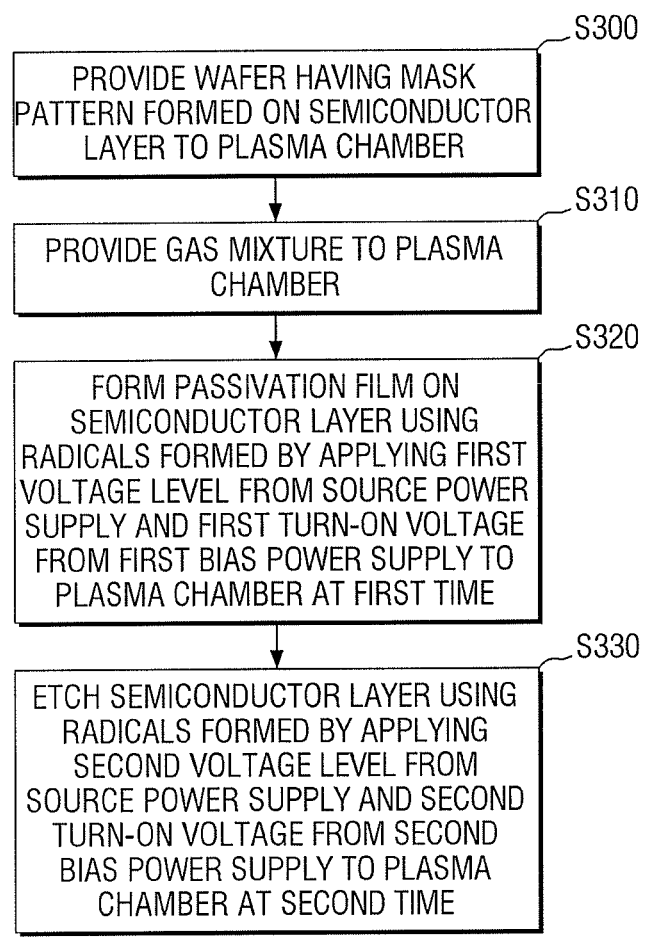
FIG. 9 illustrates another embodiment of a method for manufacturing a semiconductor device.
Figure 10A:
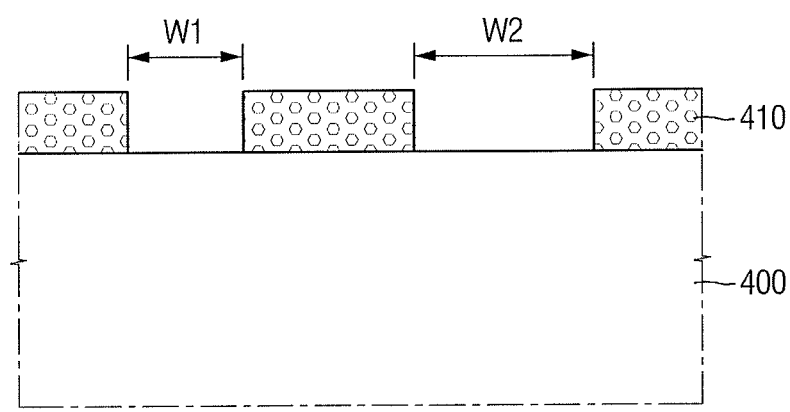
FIGS. 10A-10C illustrate various stages of an embodiment of a method for manufacturing a semiconductor device.
Figure 10B:
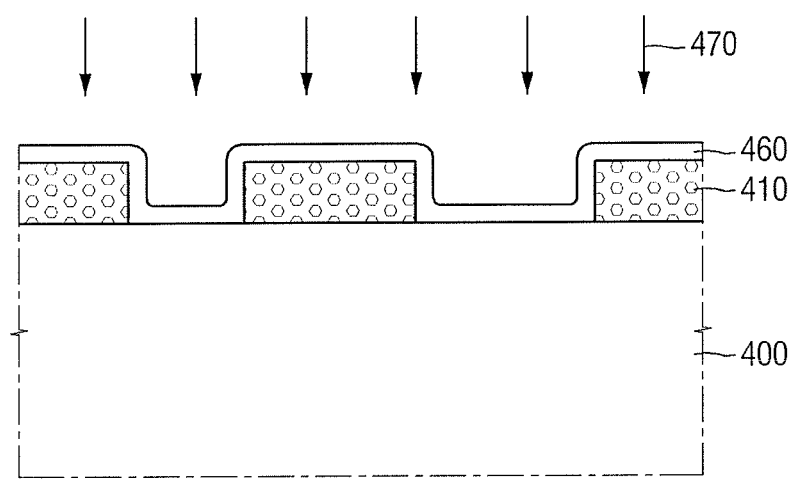
Figure 10C:
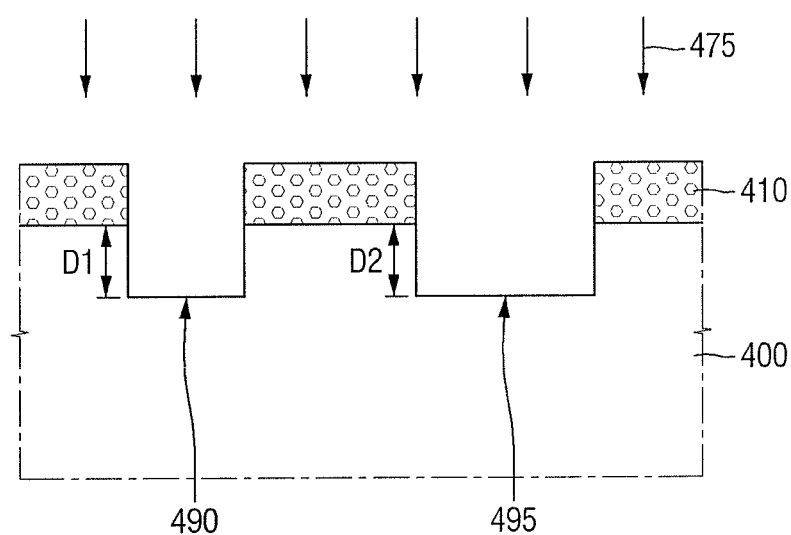

FIG. 9 illustrates another embodiment of a semiconductor manufacturing method. FIGS. 10A-10C illustrate operations included in the semiconductor manufacturing method of FIG. 9, as performed by a semiconductor manufacturing device according to one or more embodiments.

Referring to FIGS. 9 and 10A, a wafer W having a mask pattern 410 formed on a semiconductor layer 400 is provided to a plasma chamber 110 (operation S300). A gas mixture is provided to the plasma chamber 110 (operation S310). The mask pattern 410 having openings of a first width W1 and a second width W2, respectively, is formed on the semiconductor layer 400. The semiconductor layer 400 may include, but is not limited to, silicon or a silicon oxide film. The mask pattern 410 may include, but not limited to, a silicon nitride film or a silicon carbon nitride film.

Referring to FIGS. 9 and 10B, at a first time, a source voltage of a first level is applied from a source power supply 210 to the plasma chamber 110, and a first bias voltage of a first turn-on voltage $V_{ON1}$ is applied from a first bias power supply 220 to the plasma chamber 110 to form radicals 470. The radicals 470 are incident on the water W to form a passivation film 460 on the semiconductor layer 400. Since a deposition reaction and a sputtering reaction of the radicals 470 are generated simultaneously as described above, the profile of the passivation film 460 formed on the semiconductor layer 400 and the mask pattern 410 may be conformal.

Referring to FIGS. 9 and 10C, at a second time, a source voltage of a second level is applied from the source power supply 210 to the plasma chamber 110, and a second bias voltage of a second turn-on voltage $V_{ON2}$ is applied from the second bias power supply 230 to the plasma chamber 110 to form radicals 475. The radicals 475 are incident on the wafer W to etch the semiconductor layer 400 (operation S330).

As described above, the mask pattern 410 is formed on the semiconductor layer 400 to have the openings of the first width W1 and the second width W2 which are different from each other. When the semiconductor layer 400 is etched using the mask pattern 410, the shapes of openings of different widths in the mask pattern 410 are transferred to form trenches 490 and 495 having different widths in the semiconductor layer 400. The number of the radicals 475 incident on the second trench 495 of the second width W2 may be greater than the number of the radicals 475 incident on the first trench 490 of the first width W1.

In the semiconductor manufacturing method used by the semiconductor manufacturing device according to one or more embodiments, etch depths of the first trench 490 and the second trench 495 may be kept equal to each other while the deposition of the passivation film 460 and the etching of the semiconductor layer 400 are repeated. For example, since more radicals 470 are incident on the opening of the second width W2 at the first time, the passivation film 460 formed in the opening of the second width W2 may be thicker than the passivation film 460 formed in the opening of the first width W1. Therefore, when the first trench 490 and the second trench 495 are etched, the etch depths of the first trench 490 and the second trench 495 may be offset by the passivation film 460 formed in the second trench 495, and the etch depth of the first trench 490 and the etch depth of the second trench 495 may be controlled to remain substantially equal.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, matching circuits, and other signal generating and signal processing circuits may be implemented in logic which, for example, may include hardware, software, or both. When implemented at least partially in hardware, the controllers, matching circuits, and other signal generating and signal processing circuits may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, matching circuits, and other signal generating and signal processing circuits may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one embodiment, a non-transitory computer-readable medium (e.g., memory or other storage device) stores code for operating a processor. The processor may include, for example, any of the types of processors or signal generating or signal processing circuits described herein, taken alone in combination with the RF controller discussed in accordance with any of the aforementioned embodiments, e.g., RF controller 300. Such a processor is illustratively shown as processor 301 in FIG. 1 and processor 511 in FIG. 8.

The code stored in the non-transitory computer-readable medium may be, for example, any type of control software for the semiconductor manufacturing device described herein. The computer-readable medium may be a volatile or non-volatile memory or other storage device, which may be removably or fixedly coupled to the computer, processor, controller, or other signal processing device which is to execute the code or instructions for performing the method embodiments described herein.

The computer-readable medium may store first code to apply a first source voltage to a plasma chamber at a first time, second code to apply a second source voltage to the plasma chamber at a second time, third code to apply a first turn-on voltage to the plasma chamber at the first time and a first turn-off voltage to the plasma chamber at the second time, and fourth code to apply a second turn-off voltage to the plasma chamber at the first time and a second turn-on voltage to the plasma chamber at the second time. The plasma chamber may include a gas mixture and wherein plasma of a first condition is to be generated in the plasma chamber at the first time and plasma of a second condition is to be generated in the plasma chamber at the second time. The source voltages, turn-on voltages, turn-off voltages, and plasmas of first and second conditions may be in accordance with those in any of the embodiments described herein.

In the first condition, radicals are formed in the plasma chamber by dissociating the gas mixture based on the first source voltage and the radicals are to be incident on a wafer in the plasma chamber with a first energy based on the first turn-on voltage. In the second condition, radicals are to be formed in the plasma chamber by dissociating the gas mixture based on the second source voltage and the radicals are to be incident on the wafer with a second energy based on the second turn-on voltage. These first and second conditions may be understood, for example, in accordance with any of the aforementioned embodiments.

The computer-readable medium may include fifth code to control impedance matching between matching circuits connected between the plasma chamber and corresponding power supplies, as described in accordance with any of the aforementioned embodiments. For example, the fifth code may control capacitances of a first number of the matching circuits at the first time, and an operating frequency one or more of the corresponding power supplies.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor manufacturing device, comprising:
a plasma chamber configured to receive a gas mixture containing a first gas and a second gas different from each other, the plasma chamber including a first electrode and a second electrode;
a controller configured to control a source power supply, a first bias power supply, and a second bias power supply, wherein the controller is configured to:
control the source power supply to apply a source voltage of a first level to the first electrode for a first period and a source voltage of a second level different from the first level to the first electrode for a second period, the second period not overlapping the first period;
control the first bias power supply to apply a first turn-on voltage to the first electrode for the first period and a first turn-off voltage to the first electrode for the second period, the first turn-off voltage being less than the first turn-on voltage; and
control the second bias power supply to apply a second turn-off voltage to the first electrode for the first period and a second turn-on voltage to the first electrode for the second period, the second turn-off voltage being less that the second turn-on voltage;
a first matching circuit connected between the source power supply and the first electrode of the plasma chamber;
a second matching circuit connected between the first bias power supply and the first electrode of the plasma chamber; and
a third matching circuit connected between the second bias power supply and the first electrode of the plasma chamber,
wherein:
the plasma chamber is configured to form a plasma of a first condition from the gas mixture based on the source voltage of the first level and the first turn-on voltage for the first period,
the plasma chamber is configured to form a plasma of a second condition, which is different from the first condition, from the gas mixture based on the source voltage of the second level and the second turn-on voltage for the second period, and
the controller is configured to control impedance matching between the first through third matching circuits and the first electrode of the plasma chamber, wherein the controller is configured to control impedance matching by controlling capacitances of the first matching circuit and the second matching circuit for the first period and is configured to control an RF frequency of the source power supply and an RF frequency of the second bias power supply during the second period to match impedance with an electric circuit formed by the first and second electrodes.

2. The device as claimed in claim 1, wherein in the first condition:
the plasma chamber is configured to form radicals by dissociating the gas mixture based on the source voltage of the first level and is to cause the radicals to be incident on a wafer with a first energy based on the first turn-on voltage.

3. The device as claimed in claim 2, wherein in the second condition:
the plasma chamber is configured to form radicals by dissociating the gas mixture based on the source voltage of the second level and is configured to cause the radicals to be incident on a wafer with a second energy different from the first energy based on the second turn-on voltage.

4. The device as claimed in claim 3, wherein the first energy is less than the second energy.

5. The device as claimed in claim 1, wherein a minimum RF frequency of the source power supply is greater than a maximum RF frequency of the second bias power supply.

6. The device as claimed in claim 1, wherein a ratio of the first gas to the second gas in the gas mixture is maintained constant for the first period and for the second period.

7. The device as claimed in claim 1, wherein:
the first gas includes fluorocarbon ($C_xF_y$), and
the second gas includes oxygen ($O_2$).

8. A semiconductor manufacturing device, comprising:
a plasma chamber configured to receive a gas mixture containing a first gas and a second gas different from each other, the plasma chamber including an electrode;
a controller configured to control a source power supply, a first bias power supply, and a second bias power supply, wherein the controller is configured to:
control the source power supply to apply a source voltage of a first level to the electrode of the plasma chamber for a first period and a source voltage of a second level different from the first level to the electrode of the plasma chamber for a second period;
control the first bias power supply to apply a first turn-on voltage to the electrode of the plasma chamber for the first period and a first turn-off voltage to the electrode of the plasma chamber for the second period; and
control the second bias power supply to apply a second turn-off voltage to the electrode of the plasma chamber for the first period and a second turn-on voltage to the electrode of the plasma chamber for the second period;

a first matching circuit connected between the source power supply and the electrode of the plasma chamber;
a second matching circuit connected between the first bias power supply and the electrode of the plasma chamber; and
a third matching circuit connected between the second bias power supply and the electrode of the plasma chamber, wherein:
the controller is configured to control impedance matching between the first through third matching circuits and the electrode of the plasma chamber, wherein the controller is configured to control impedance matching by controlling capacitances of the first matching circuit and the second matching circuit for the first period and is configured to control impedance matching by controlling an RF frequency of the source power supply and an RF frequency of the second bias power supply for the second period.

9. The device as claimed in claim 8, wherein the plasma chamber is configured to:
form plasma of a first condition from the gas mixture through the source power supply and the first bias power supply for the first period, and
form plasma of a second condition, which is different from the first condition, from the gas mixture through the source power supply and the second bias power supply for the second period.

10. The device as claimed in claim 9, wherein in the first condition:
the plasma chamber is configured to form radicals by dissociating the gas mixture using the source voltage of the first level and is configured to cause the radicals to be incident on a wafer with a first energy based on the first turn-on voltage.

11. The device as claimed in claim 10, wherein in the second condition:
the plasma chamber is configured to form radicals by dissociating the gas mixture using the source voltage of the second level and is configured to cause the radicals to be incident on a wafer with a second energy less than the first energy based on the second turn-on voltage.

12. The device as claimed in claim 11, wherein the controller is configured to maintain:
the source voltage of the first level and the first turn-on voltage for a first duty cycle from the first period, and
the source voltage of the second level and the second turn-on voltage for a second duty cycle from the second period.

13. A method of operating a semiconductor manufacturing device, the method comprising:
providing a gas mixture containing a first gas and a second gas different from each other to a plasma chamber, the plasma chamber including an electrode;
supplying a source voltage of a first level to the electrode of the plasma chamber for a first period and a source voltage of a second level different from the first level to the electrode of the plasma chamber for a second period by a source power supply, wherein a first matching circuit is connected between the source power supply and the electrode of the plasma chamber;
supplying a first turn-on voltage to the electrode of the plasma chamber for the first period and a first turn-off voltage to the electrode of the plasma chamber for the second period by a first bias power supply, wherein a second matching circuit is connected between the first bias power supply and the electrode of the plasma chamber;
supplying a second turn-off voltage to the electrode of the plasma chamber for the first period and a second turn-on voltage to the electrode of the plasma chamber for the second period by a second bias power supply, wherein a third matching circuit is connected between the second bias power supply and the electrode of the plasma chamber;
forming a plasma of a first condition from the gas mixture by applying the source voltage of the first level and the first turn-on voltage to the electrode of the plasma chamber for a first period; and
forming a plasma of a second condition from the gas mixture by applying the source voltage of the second level and the second turn-on voltage to the electrode of the plasma chamber for a second period, wherein the first condition is different from the second condition, and
impedance is matched between the first through third matching circuits and the electrode of the plasma chamber, impedance matching being controlled by controlling capacitances of the first matching circuit and the second matching circuit for the first period and by controlling an RF frequency of a source power supply and an RF frequency of a second bias power supply during the second period.

14. The method as claimed in claim 13, wherein forming the plasma of the first condition includes:
forming radicals by dissociating the gas mixture using the source voltage of the first level, and
causing the radicals to be incident on a wafer with a first energy based on the first turn-on voltage.

15. The method as claimed in claim 14, wherein forming the plasma of the second condition includes:
forming radicals by dissociating the gas mixture using the source voltage of the second level, and
causing the radicals to be incident on the wafer with a second energy different from the first energy based on the second turn-on voltage.

16. The method as claimed in claim 15, wherein the first energy is less than the second energy.

17. The method as claimed in claim 13, wherein an RF frequency of the source voltage is greater than an RF frequency of the second turn-on voltage.

18. The device as claimed in claim 1, wherein in the first condition:
the plasma chamber is configured to form radicals generated using the source voltage of the first level and is configured to cause the radicals having low ion incident energy to generate a deposition reaction on a wafer.

19. The device as claimed in claim 1, wherein in the first condition:
the plasma chamber is configured to accelerate ion particles with a first energy by applying a first bias voltage of the first turn-on voltage and is configured to cause the ion particles accelerated with a first energy to generate a sputtering reaction on a wafer.

* * * * *